(12) United States Patent
Hegeler

(10) Patent No.: US 6,289,058 B1
(45) Date of Patent: Sep. 11, 2001

(54) METHOD AND CIRCUIT ARRANGEMENT FOR DETECTING SHORT PULSES OF A DIGITAL INPUT SIGNAL

(75) Inventor: Wilhelm Hegeler, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/108,508

(22) Filed: Jul. 1, 1998

(30) Foreign Application Priority Data

Jul. 19, 1997 (DE) .............................. 197 31 112

(51) Int. Cl.$^7$ .................................................. H04L 27/06
(52) U.S. Cl. ............................................................. 375/340
(58) Field of Search .................................. 375/316, 340

(56) References Cited

U.S. PATENT DOCUMENTS 3,972,000 * 7/1976 Desblache et al. .................. 375/350
4,652,775 * 3/1987 Daudelin .............................. 375/317
5,390,030   2/1995 Kudose .
5,940,136 * 8/1999 Abe et al. ............................. 348/537

FOREIGN PATENT DOCUMENTS 0 465 334   1/1992 (EP) .

* cited by examiner

Primary Examiner—Tesfaldet Bocure
(74) Attorney, Agent, or Firm—Kenyon & Kenyon

(57) ABSTRACT

The detection of short pulses of a digital input signal by an evaluation circuit, whose time intervals for polling the input signal are long compared to the duration of the pulses, is made possible by the formation of a difference between the input signal and an output signal formed from the input signal. A change in the output signal is effected proportionally to the difference with a large proportionality factor when the difference has a first operational sign, and proportionally to the difference with a small proportionality factor when the difference has another operational sign.

5 Claims, 1 Drawing Sheet

METHOD AND CIRCUIT ARRANGEMENT FOR DETECTING SHORT PULSES OF A DIGITAL INPUT SIGNAL

FIELD OF THE INVENTION

The present invention relates to a method and circuit arrangement for detecting short pulses of a digital input signal by using an evaluation circuit, whose time intervals for polling the input signal are long compared to the duration of the pulses.

BACKGROUND INFORMATION

The problem sometimes arises that sporadically occurring pulses need to be detected, whose amplitude, frequency and, in some instances, duration provide useful information. An example of this is a multi-path detection circuit, as used in radios, which supplies irregularly occurring needle pulses, whose amplitude, duration, and frequency serve as an index for the magnitude of the interference resulting from the reception of direct and reflected transmission signals. The situation is similar for a detection circuit used for interferences from an adjacent channel (side-to-side crosstalk). The pulses of interest occur regularly as pulse-shaped breaks in the useful signal level. Thus, the pulses of interest are evaluated as negative pulses, but they can also be evaluated as positive pulses. These pulses are analyzed as measured variables using a microprocessor, which, because of its other tasks, is not able to poll the relevant input signal much more frequently than, for instance, every 10 ms. Therefore, it does not make sense to read the instantaneous values of the input signal into the microprocessor. Because of the short duration of the pulses, even a mean value generation, which would be easier to implement using digital signals, does not provide useful information.

SUMMARY OF THE INVENTION

An object of the present invention is to provide a method and a circuit arrangement that use digital processing to detect and analyze the short-term pulses of an input digital signal. This detection and evaluation performed by the present invention is carried out with the aid of an evaluation circuit that can capture the input signal at considerably shorter sampling frequencies than would be required under the sampling theorem.

The present invention achieves this object using a method of the type mentioned above, characterized by the formation of a difference between the input signal and an output signal formed from the input signal. When the difference has a first operational sign, the change in the input signal is effected proportionally to the difference with a large proportionality factor. When the difference has another operational sign, the change in the input signal is effected proportionally to the difference with a small proportionality factor.

With the method of the present invention, therefore, an output signal is formed that, because of the short input pulses, can change quickly, thus following quickly on the input pulses tendentially, but that changes only slowly when the input signal has no pulses, so that the drop in the output signal to the level of "no pulses," which, for instance, can be a noise level, occurs relatively slowly. In this manner, the output signal formed is influenced by the amplitude of the pulses, the frequency of occurrence of the pulses, and their duration, so that the microprocessor polling the output signal at relatively long intervals of time queries a signal level that stands in good relation to the frequency, duration, and magnitude of the pulses. As a consequence, for instance, a useful indication about the quality of a received signal in a radio is provided.

In a very simple and preferred specific embodiment of the method, the difference formed is multiplied in a first branch by a first multiplication factor (a) and, in a parallel second branch after its absolute value is formed, is multiplied by a second multiplication factor (b); thereafter, the output signals of both branches are added together, producing, in a simple manner, the proportionality factor (a + b) for a positive difference and the proportionality factor (a - b) for a negative difference.

A realization of the method described in the present invention in a microprocessor, for the subsequent processing of the signal prepared in the manner described in the present invention, for instance, for the purpose of forming a still larger time constant, can be effected in a simple manner. In particular, in the microprocessor, the difference between the input signal and the output signal is formed and the microprocessor determines whether the difference is positive or negative. If the difference, for instance, is positive, the difference formed is shifted in the working memory by a first increment $n_1$ spaces to the right, corresponding to an evaluation of the difference with a multiplication factor $1/2^{n_1}$. If the difference is negative, there occurs a shift by an increment $n_2$ spaces ($n_2 > n_1$), producing different valuation with $1/2^{n_2}$, so that, in this simple manner, two different evaluation factors for the difference are created. The difference evaluated in this manner is then added to or subtracted from the previously existing output signal in order to reduce the difference between the input signal and the output signal.

To implement the method described in the present invention, a circuit arrangement is provided with an input connection for an input signal and an output connection for an output signal. The circuit arrangement includes a subtraction stage, which is able to be supplied with the input signal and the output signal, delayed by one time pulse, a discriminator relating to the different operational signs of the difference, and a multiplication stage for the formation of different proportionality factors. These different proportionality factors are formed as a function of the operational sign of the difference in order to change the output signal proportionally to the difference.

According to a variant of the circuit arrangement of the present invention, a first branch having a first multiplication stage having a factor (a) is linked to the subtraction stage, and a second branch is connected in parallel to the first branch; the second branch has an absolute-value generator and a second multiplication stage having a factor (b), a first addition stage, to whose inputs the outputs of the two branches are connected, and a second addition stage, to which the output signal, delayed by one time pulse, and the output signal of the first addition stage can be routed.

The preferred use of the circuit arrangement of the present invention and the preferred application of the method of the present invention lie in the detection of the reception quality of a radio receiver, in which certain interferences produce irregularly occurring needle pulses.

DETAILED DESCRIPTION

Figure 1:
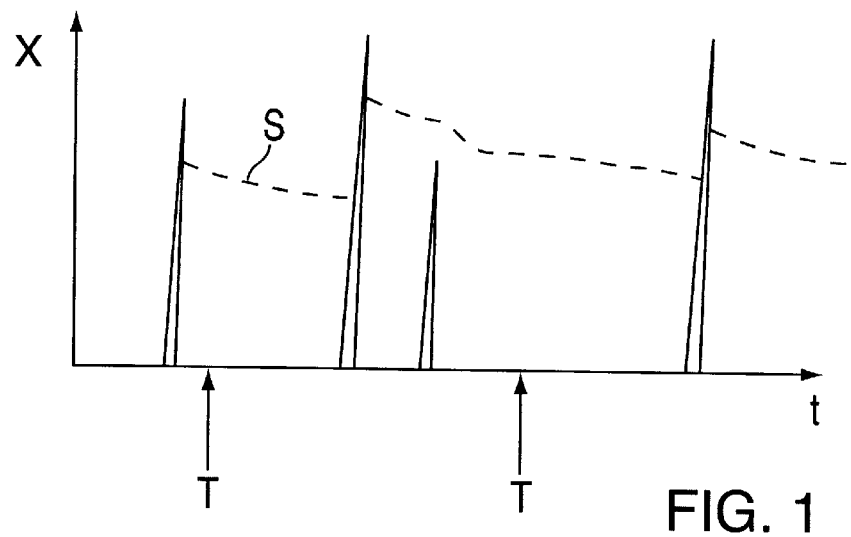
FIG. 1 shows a graphic representation of values of an input signal as a function of time and the values of an output signal formed therefrom.

FIG. 1 shows schematically, in solid lines, the variation with time of an input signal X, which includes sporadically occurring needle pulses of a variable magnitude. Also drawn in, by way of example, are the polling times T when a microprocessor can sample input signal X. It can be seen that the sampling of the instantaneous values of input signal X in the represented exemplary embodiment would be independent of the occurring needle pulses, which, however, contain the desired information, which, for instance, relate to the interference of a radio receiver.

According to the present invention, an output signal S is formed, which is represented in FIG. 1 with a dashed line.

Output signal S follows input signal X quickly and virtually completely when input signal X is greater than output signal S. If, however, input signal X is lower, for instance, after a needle pulse has ended, output signal S approaches input signal X only slowly, and thus, as a result, a small proportionality factor relating to the difference between the input signal and the output signal is formed.

With regard to the representation of FIG. 1, consideration should be given to the fact that the values of input signal X are digital numerical values, which are also supposed to be processed digitally according to the present invention.

Figure 2:
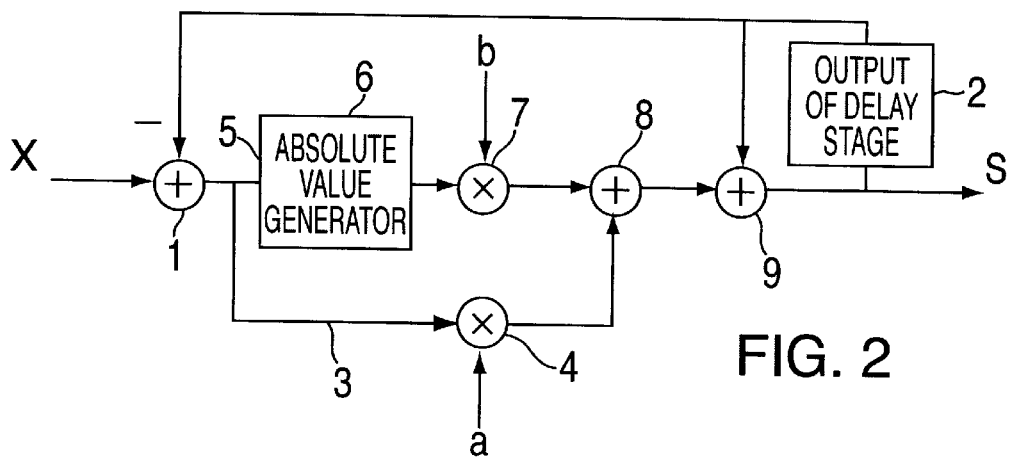
FIG. 2 shows a simple exemplary embodiment of a circuit for forming an output signal as per FIG. 1.

FIG. 2 illustrates an exemplary embodiment of a circuit arrangement for forming an output signal S based on input signal X. Input signal X is routed to a first input of subtraction stage 1. The other input of subtraction stage I is supplied with the output of delay stage 2, which produces output signal S delayed by one time pulse. The formed difference X–S is routed to a first branch 3 and is multiplied there in a first multiplication stage 4 by a factor a. Parallel to first branch 3 is a second branch 5 containing an absolute value generator 6, whose output signal is routed to a second multiplication stage 7 that performs a multiplication by a factor b. (It is also possible initially to perform multiplication stage 7 using the factor b and then to form the absolute value using absolute value generator 6). The output signals from the two multiplication stages 4, 7 are routed to an adder 8. Output signal S, delayed in delay stage 2, is added to the formed sum signal in a further addition stage 9, forming active output signal S.

The represented circuit functions according to the equation:

$$S=S+a(X-S)+b\,ABS(X-S).$$

When input value X is greater than the formed output value S, the difference is positive. In this case, the following applies:

$$S=S+(a+b)(X-S).$$

Therefore, the adjustment to higher input value X is effected with a large proportionality factor (a+b), and thus occurs quickly.

If, however, X is less than S, the following applies:

$$S=S-(a-b)(X-S).$$

The drop in output signal S to a lower input value X, therefore, occurs with a smaller proportionality factor (a–b), and thus occurs slowly.

From the above considerations, it must hold then that: a>b, b>0 and a+b<1.

The significance of this algorithm is that the occurrence of a needle pulse, whose amplitude value lies below instantaneous output signal S, somewhat reduces the drop in output signal S, as represented in FIG. 1 based on the example of a needle pulse.

When the needle pulses are formed through breaks in a signal level, and are therefore constructed as negative pulses compared to the signal level, output signal S is determined by the lower peaks of the needle pulses. In this case, it is sufficient to subtract the weighted absolute value of the difference (the output signal of second branch 5) from the output signal of the first branch 3, and not, as in FIG. 2, to add them. This exemplary embodiment of the method of the present invention and the circuit arrangement of the present invention are well-suited, in particular, for the application of the exemplary embodiment depicted in FIG. 3.

Figure 3:
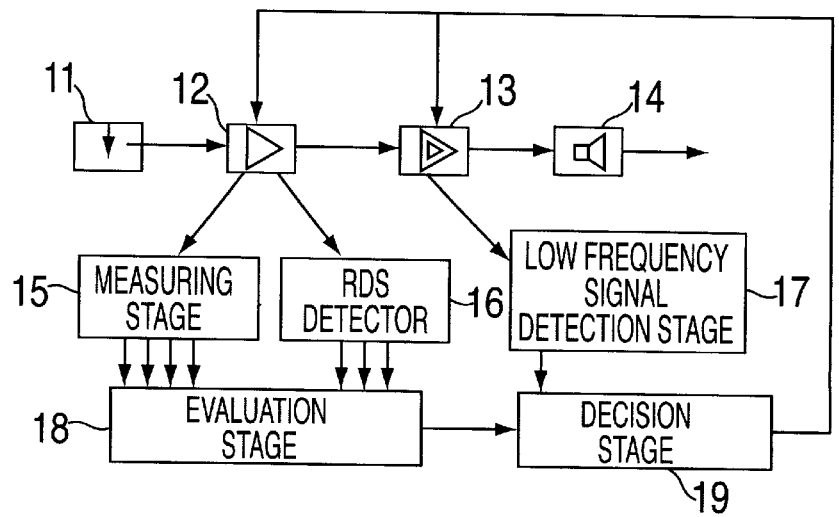
FIG. 3 shows a schematic representation of a preferred application of the circuit arrangement of the present invention for detecting and analyzing interference in a car radio.

FIG. 3 shows a main signal path of a radio receiver, in particular a car radio having an antenna 11, a high frequency section 12, which contains a tuning device, a low frequency section 13, and a loudspeaker 14.

Using signals of frequency stage 12, measurement values M are captured in the known manner using a measuring stage 15, which can have, for instance, a multipath detector, an adjacent channel detector, a field strength measurement device, etc. In a receiver equipped for RDS (Radio Data System) signals, an RDS-decoder 16 is connected to high frequency stage 12. Information about the quality of the receiving transmitter is also available via RDS-decoder 16.

Signals of low frequency stage 13 are generally detected by a low-frequency signal level detector to check whether a signal level threshold is exceeded or not.

The output signals from measuring stage 15 are routed, together with the quality information from RDS detector 16, to an evaluation stage 16, in particular, the multi-path detector of the adjacent channel detector in measuring stage 15 produces, as an index for interferences, needle-shaped output pulses that are preprocessed in evaluation stage 18, for instance using the circuit according to FIG. 2, and analyzed by a microprocessor. If, in this case, a relevant degree of interference is determined for the receiving transmitter, this information is correlated in a decision stage 19 with the information from the low frequency signal detection stage 17; thereafter, if applicable, high-frequency stage 12 and low-frequency stage 13 are instructed to perform a search for an alternate frequency of this transmitter and, if applicable, a test of the alternate frequency.

What is claimed is:

1. A method of detecting short pulses of a digital input signal by using time intervals of an evaluation circuit, each one of the time intervals having a duration that is long in comparison to a duration of a corresponding one of the short pulses, the method comprising the steps of:

forming an output signal as a function of the digital input signal;

forming a difference signal as a function of a difference between the digital input signal and the output signal;

using a first proportionality factor when the difference signal has a first operational sign to effect a first change in the output signal that is proportionate to the difference signal; and using a second proportionality factor when the difference signal has a second operational sign to effect a second change in the output signal that is proportionate to the difference signal.

2. The method according to claim 1, further comprising the steps of:

multiplying the difference signal by a first multiplication factor in a first branch of the evaluation circuit in order to determine an output of the first branch;

forming an absolute value of the difference signal in a second branch of the evaluation circuit that is parallel to the first branch;

multiplying the absolute value of the difference signal by a second multiplication factor in the second branch in order to determine an output of the second branch;

adding the output of the first branch and the output of the second branch in order to form a sum; and subjecting the sum to the output signal.

3. A circuit arrangement, comprising:

an input for receiving an input signal;

an output for providing an output signal;

a subtraction stage having a first input for receiving the input signal and a second input for receiving the output signal delayed by one time pulse, the subtraction stage forming a difference signal that is a function of a difference between the input signal and the output signal delayed by one time pulse;

a discriminator for assigning at least one of a first operational sign and a second operational sign to the difference signal; and a multiplication stage for forming at least one of a first proportionality factor and a second proportionality factor as a function of the difference signal in order to effect a change in the output signal that is proportional to the difference signal.

4. The circuit arrangement according to claim 3, further comprising:

a first branch coupled to the subtraction stage and including a first multiplication portion of the multiplication stage for providing a first multiplication factor;

a second branch coupled in parallel to the first branch, the second branch including an absolute value generator and a second multiplication portion of the multiplication stage for providing a second multiplication factor;

a first addition stage having a first input coupled to an output of the first branch and a second input coupled to an output of the second branch; and a second addition stage having a first input coupled to an output of the first addition stage and a second input for receiving the output signal delayed by one time pulse.

5. The circuit arrangement according to claim 4, wherein the circuit arrangement detects a reception quality of a radio receiver, in which certain interferences lead to irregularly occurring needle pulses.

\* \* \* \* \*